(12) United States Patent
Bauman et al.

(10) Patent No.: US 6,906,253 B2
(45) Date of Patent: Jun. 14, 2005

(54) METHOD FOR FABRICATING A SOLAR TILE

(75) Inventors: John Scott Bauman, Fall City, WA (US); Craig S. Flora, Longmont, CO (US)

(73) Assignee: The Boeing Company, Seattle, WA (US)

( * ) Notice: Subject to any disclaimer, the term of this patent is extended or adjusted under 35 U.S.C. 154(b) by 539 days.

(21) Appl. No.: 10/180,795

(22) Filed: Jun. 26, 2002

(65) Prior Publication Data

US 2002/0166580 A1 Nov. 14, 2002

Related U.S. Application Data

(62) Division of application No. 09/812,343, filed on Mar. 20, 2001, now Pat. No. 6,476,314.

(51) Int. Cl.[7] .......................... H01L 31/05; H01L 31/18
(52) U.S. Cl. ..................... 136/256; 136/244; 136/251; 257/459; 438/98; 438/80; 438/66; 438/67; 438/64
(58) Field of Search ................................. 136/256, 244, 136/251; 257/459; 438/98, 80, 66, 67, 64

(56) References Cited

U.S. PATENT DOCUMENTS

| | | | | |
|---|---|---|---|---|
| 3,376,164 A | * | 4/1968 | Bachwansky | 136/251 |
| 3,508,063 A | * | 4/1970 | Granger et al. | 136/244 |
| 4,133,697 A | * | 1/1979 | Mueller et al. | 136/245 |
| 4,334,354 A | * | 6/1982 | Luft et al. | 29/840 |
| 4,602,417 A | * | 7/1986 | Mesch et al. | 29/564 |
| 5,021,099 A | * | 6/1991 | Kim et al. | 136/244 |
| 5,100,808 A | | 3/1992 | Glenn | |
| 5,118,361 A | | 6/1992 | Fraas et al. | |
| 5,123,968 A | | 6/1992 | Fraas et al. | |
| 5,185,042 A | * | 2/1993 | Ferguson | 136/244 |

(Continued)

FOREIGN PATENT DOCUMENTS

| | | | | |
|---|---|---|---|---|
| JP | 61-116882 A | * | 6/1986 | |
| WO | WO 93/24960 | * | 12/1993 | H01L/31/06 |

OTHER PUBLICATIONS

Flora et al, Advanced Solar Tile Design and Performance, Aerospace Conference Proceedings, IEEE, vol. 5, pp. 5-2429 to 5-2432, Mar. 9-16, 2002.*

*Primary Examiner*—Alan Diamond
(74) *Attorney, Agent, or Firm*—Alston & Bird LLP

(57) ABSTRACT

The present invention provides a solar tile and method for fabricating the same. The solar tile includes a flexible circuit having at least one electrically conductive path laminated between two insulating sheets. The flexible circuit includes a plurality of openings that are completely through the flexible circuit and define contact locations with the electrically conductive path. The solar tile also includes a plurality of coplanar photovoltaic solar cells that are secured to the flexible circuit so that the contacts are aligned with the openings in the flexible circuit. Further, the solar tile includes a plurality of electrically conductive solder connections located within the openings in the flexible circuit to electrically connect the solar cell contacts and the electrically conductive path. Additionally, in a preferred embodiment, the solar tile includes a single coverslide situated adjacent and covering the plurality of solar cells opposite the flexible circuit.

6 Claims, 5 Drawing Sheets

U.S. PATENT DOCUMENTS

| | | | |
|---|---|---|---|
| 5,261,969 A | | 11/1993 | Stanbery |
| 5,266,125 A | | 11/1993 | Rand et al. |
| 5,421,908 A | * | 6/1995 | Yoshida et al. ............. 136/244 |
| 5,547,516 A | | 8/1996 | Luch |
| 5,582,653 A | * | 12/1996 | Kataoka et al. ............. 136/251 |
| 5,593,901 A | * | 1/1997 | Oswald et al. ................ 438/80 |
| 5,667,595 A | | 9/1997 | Vaverka et al. |
| 5,667,596 A | | 9/1997 | Tsuzuki et al. |
| 5,735,966 A | | 4/1998 | Luch |
| 5,800,632 A | | 9/1998 | Arao et al. |
| 5,928,437 A | * | 7/1999 | Dillard ........................ 136/244 |
| 6,156,967 A | * | 12/2000 | Ralph et al. ................. 136/244 |
| 6,313,396 B1 | * | 11/2001 | Glenn ......................... 136/256 |
| 6,444,899 B2 | * | 9/2002 | Kubota et al. .............. 136/256 |
| 6,476,314 B2 | * | 11/2002 | Bauman et al. ............. 136/256 |
| 6,531,653 B1 | * | 3/2003 | Glenn et al. ................. 136/256 |
| 2001/0027805 A1 | * | 10/2001 | Ho et al. ..................... 136/256 |

* cited by examiner

METHOD FOR FABRICATING A SOLAR TILE

CROSS-REFERENCE TO RELATED APPLICATIONS

This application is a divisional of U.S. application Ser. No. 09/812,343, filed Mar. 20, 2001 now U.S. Pat. No. 6,476,314.

FIELD OF THE INVENTION

The present invention relates to solar tiles and, more particularly, to a solar tile having solar cells with coplanar contacts and method for fabricating the same employing a flexible circuit to interconnect a plurality of solar cells.

BACKGROUND OF THE INVENTION

Photovoltaic (PV) solar cells are used more extensively every day as an alternative energy source. Typically, a PV solar cell is used to provide solar power for a multitude of applications, both terrestrial and space. The more widespread of the two applications, terrestrial, mainly consists of solar powered consumer products, such as calculators, remote power applications, such as remote telecommunications power supplies, and utility generation applications, such as home electricity generation. Space solar power applications, on the other hand, mainly consist of solar power for space satellites.

As stated above, solar cells are employed by the terrestrial and space industries to provide solar power for numerous applications. Conventional PV solar cells create energy by converting sunlight directly into direct current (DC) electricity, and typically consist of a P-N or N-P junction semiconductor such as single-crystal silicon (Si), gallium arsenide (GaAs) or a gallium arsenide/germanium (GaAs/Ge) class of cells with a dual-junction or triple-junction arrangement. When PV cells are exposed to sunlight, the cell absorbs a portion of the light. The absorbed light excites electrons within the p-type region of the semiconductor, and those electrons flow into the n-type region. The electrons build up a negative charge in the n-type region and, through a load connecting the p-type and n-type regions, flow back to the p-type region. The flow of electrons across the load creates an electric current and, thus, power across the load.

Most conventional PV cells use a top/bottom contact arrangement whereby the current from a front surface of the cell is channeled, via metal grids, to a front contact while separate contacts are placed on a rear surface to access the rear polarity. Referring to FIG. 1, some PV cells 10 consist of a coplanar arrangement whereby a contact from the front surface 20 is wrapped around or through the cell to the rear surface so that both the positive 40 and negative 60 contacts are on the rear surface 30. In coplanar PV cells having a wrapped around configuration, an insulating, dielectric material 50, is typically wrapped around the PV cell between the cell and the wrapped-around contact to isolate the contact from the remainder of the PV cell. Whereas PV cells consist of a variety of different material arrangements, coplanar arrangements are typically only available on PV cells made from Si.

Due to the energy demands of many applications, a single PV cell generally cannot generate the desired amount of voltage or current. Therefore, to achieve a desired voltage output, multiple PV cells are electrically connected in series to form strings. These strings are then arranged in parallel configurations called arrays to achieve desired current levels for particular applications. To electrically connect the PV cells, the cells can be attached to a flexible circuit. Each PV cell is then covered by a respective glass cover plate to protect the PV cell from the environment. For example, U.S. Pat. No. 4,133,697 issued Jan. 9, 1979 to Mueller et al. (hereinafter "the '697 patent") discloses a flexible solar array strip employing printed circuitry sandwiched between a pair of layers of a polyimide material. As disclosed by the '697 patent, the solar cells are interconnected through the printed circuitry as a result of solder pads extending through apertures formed in one of the polyimide layers so as to connect the contacts on the solar cells with portions of the printed circuitry.

Generally, the same type of configurations can be used for both terrestrial and space PV cell applications. But due to differences between environments, PV cells used for space applications generally require a more precise and, thus, costly manufacturing process. Terrestrial applications have begun to use less costly alternatives to single-crystal Si, including poly-crystalline silicon and a variety of thin film PV cells, such as amorphous silicon thin film PV cells. But these alternatives have much lower efficiencies than Si or GaAs, generally making them impractical for space PV cells. In this same vein, the PV cells for space applications desirably have very small spacing between adjacent cells, such as about 0.030 inches, in order to capture a greater percentage of the incident light. In contrast, PV cells for terrestrial applications generally have greater spacing between adjacent cells so as not to require as precise of a manufacturing process. Additionally, the PV cells used for space applications must also be more reliable and longer lasting than the PV cells used for terrestrial applications since space-deployed PV cells cannot be replaced.

In addition to PV cell efficiency and reliability, space applications using PV cells must also address an array's weight and exposure to the space vacuum, radiation and plasma environments that also typically increase the required precision and cost of manufacturing. Due to cost and weight factors, space PV cells generally require very thin glass plates, typically on the order of 0.008 inches thick, whereas terrestrial PV arrays typically operate with a glass plate one-eighth of an inch thick. Typically, space PV arrays are hand-assembled and generally have non-uniform spacing between cells. And because space PV arrays typically use cells with front/rear surface contacts, space PV arrays typically require each cell to have its own glass cover plate. As such, the overall manufacturing process is slowed in order to separately place a glass cover plate on each cell. Additionally, hand assembly of space PV arrays typically decreases manufacturing precision. In this regard, to raise the amount of power generated over a given illumination area, it would be desirable to minimize the spacing between adjacent cells to about five thousandths of an inch, thereby requiring a level of precision in fabricating the tiles not generally found in hand assembly. Also, the manufacturing of space PV arrays with separate cover plates typically uses alignment pins to more accurately place each cell within a string. The use of such pins, however, can lead to the damaging of the PV cells if the pins are misaligned relative to the cells or inaccurately moved in relation to the cells. Thus, there exists a need for a space PV array that can use a single cover plate, and an associated fabrication method that is faster and more precise than conventional methods.

Not only do individual cover plates increase manufacturing cost for conventional space PV arrays, but they also typically result in both the cell edges and cell-to-cell interconnects being exposed to space plasma. To decrease potential damage caused by plasma charging, space PV array voltages are frequently maintained below 50 volts and/or all exposed interconnects are conformal coated with a dielectric material. While mitigating damage to the cells, the lower voltage results in a significant harness loss for higher power applications, and conformal coating adds additional integration cost and mass to the array. Thus, there exists a need for a space PV array that decreases the potential damage caused by plasma radiation and can safely operate above 50 volts without requiring conformal coating.

SUMMARY OF THE INVENTION

In light of the foregoing background, the present invention provides a solar tile and method for fabricating the same employing a single coverslide and/or a flexible circuit that includes openings for receiving solder that extend completely through the circuit. The method of fabricating the solar tile of the present invention is capable of machine assembly and allows the solar cells to be placed such that a single coverslide covers the entire solar tile, as opposed to individual coverslides for each solar cell. The use of a single coverslide reduces cell edge and cell-to-cell interconnect exposure to damaging plasma radiation, and allows the solar tile to safely operate above 50 volts without conformal coating of the interconnects. The solar tile of the present invention may also include a flexible circuit that includes openings for receiving solder that extend completely through the circuit to allow solder connections to be inspected during fabrication of the solar tile which allows for greater solder connection integrity.

According to one embodiment, the solar tile includes a flexible circuit having at least one electrically conductive path laminated between two insulating sheets. At least a portion of the flexible circuit includes a plurality of openings completely through the flexible circuit, including the electrically conductive path and the insulating sheets. By including the openings through the electrically conductive path, the openings define contact locations with the electrically conductive path within each opening. The solar tile also includes a plurality of photovoltaic solar cells having coplanar contacts that are secured to the flexible circuit so that the contacts are aligned with the openings in the flexible circuit. In one embodiment, the solar cells are secured to the flexible circuit so that the space between each solar cell is less than seven thousandths of an inch. Preferably, the space between each solar cell is between three and seven thousandths of an inch, with the space equaling five thousandths of an inch in a preferred embodiment. To interconnect the electrically conductive path and solar cell contacts at the contact locations, the solar tile further includes a plurality of electrically conductive solder connections located within the plurality of openings in the flexible circuit.

In one embodiment, each opening consists of an aperture, extending completely through one of the insulating sheets, and a hole, having a diameter smaller than the aperture, extending completely through the electrically conductive path and the other insulating sheet. The openings are capable of allowing a technician to inspect the electrically conductive solder connections. This helps insure solder connection integrity at the connection point between the solder connections and the solar cell contacts, and the solder connections and the electrically conductive path. The resulting solder connections adhere to their respective solar cell contacts and corresponding opening in the flexible circuit, providing interconnect structures between the electrically conductive path and the insulating sheets.

According to another aspect of the present invention, the solar tile includes a single coverslide. In this embodiment, the coverslide is situated adjacent the solar cells opposite the flexible circuit so that a single coverslide covers all of the solar cells. The coverslide of this embodiment is adapted to absorb the sun's ultraviolet radiation and, thus, acts to protect the solar cells from this environment. The coverslide preferably has a thickness less than twelve thousandths of an inch and, most commonly, has a thickness between five and twelve thousandths of an inch.

Fabricating the solar tile, according to one embodiment, begins with the creation of the plurality of openings completely through the flexible circuit, including the electrically conductive path and the insulating sheets. In embodiments where the openings consist of apertures and holes, the openings are created by first creating the apertures through one of the insulating sheets of the flexible circuit, and thereafter creating the holes, having a smaller diameter than the apertures, completely through the electrically conductive path and the other insulating sheet. Next, the electrically conductive solder material is deposited within each opening so that the solder material and an exposed portion of the electrically conductive path are in electrical communication at the respective contact location. Then, the coplanar solar cells are secured to the flexible circuit such that the solar cell contacts are aligned with the plurality of openings. The solder material is then reflowed and thereafter cooled so that the solder material and the solar cell contacts, and the solder material and the electrically conductive path are in mechanical and electrical contact.

In one embodiment, an adhesive layer is deposited on the flexible circuit before the solar cells are secured to the flexible circuit. In this embodiment, the openings are created completely through the adhesive layer and flexible circuit. The solar cells are then secured to the adhesive layer after the solder material is deposited. In a further embodiment, the adhesive layer includes a release sheet opposite the flexible circuit. In this embodiment, the openings are created completely through the release sheet in addition to the adhesive layer and the flexible circuit, and the release sheet is removed after depositing the solder material.

To insure solder connection integrity between the solder material and the solar cell contacts, and the solder material and the electrically conductive path, in one embodiment the solder material is inspected during reflowing of the solder material. In this embodiment, the solder material is viewed through the plurality of openings created through the insulating sheet opposite the plurality of solar cells to ensure that the solder material reflows. To add mechanical stability and reliability to the solar tile, the solar cells are secured to the flexible circuit by forming the solder connections so that the solder connections extend from a respective contact on the solar cell through a corresponding opening. In this embodiment, each solder connection preferably forms an interconnect structure between the electrically conductive path and the insulating sheets.

The present invention, therefore, provides a solar tile and method of fabrication that allow the solar cells to be placed such that a single coverslide covers the entire solar tile, allow inspection of solder connections during fabrication, and contain solder connections that form interconnect structures that add mechanical stability and reliability to the solar tile. The use of a single coverslide reduces cell edge and cell-to-cell interconnect exposure to damaging plasma radiation, and allows the solar tile to safely operate above 50 volts without conformal coating of the interconnects. Additionally, the flexible circuit defines openings completely therethrough that allow solder connections to be inspected during fabrication of the solar tile. Also, the solder material, deposited in the openings defined by the flexible circuit, forms interconnect structures for the solar tile.

BRIEF DESCRIPTION OF THE DRAWINGS

Figure 1:
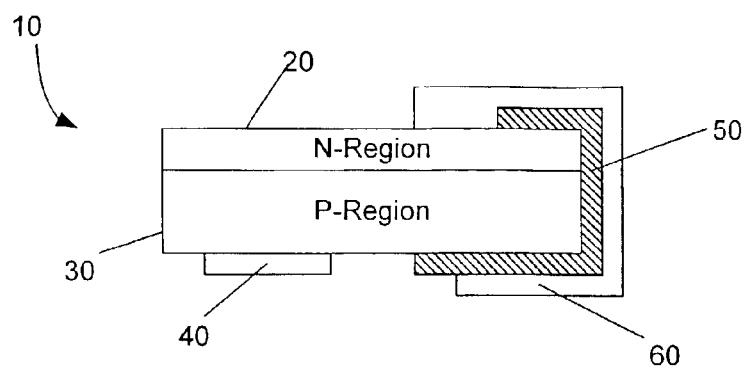
Figure 2:
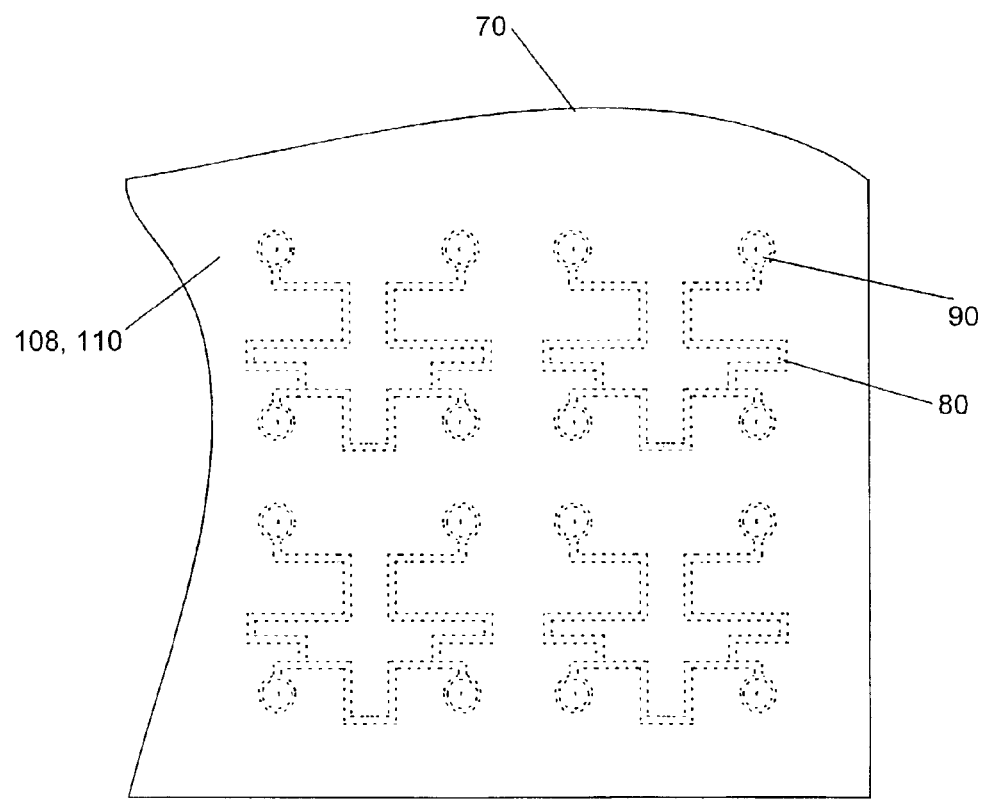
Figure 3A:
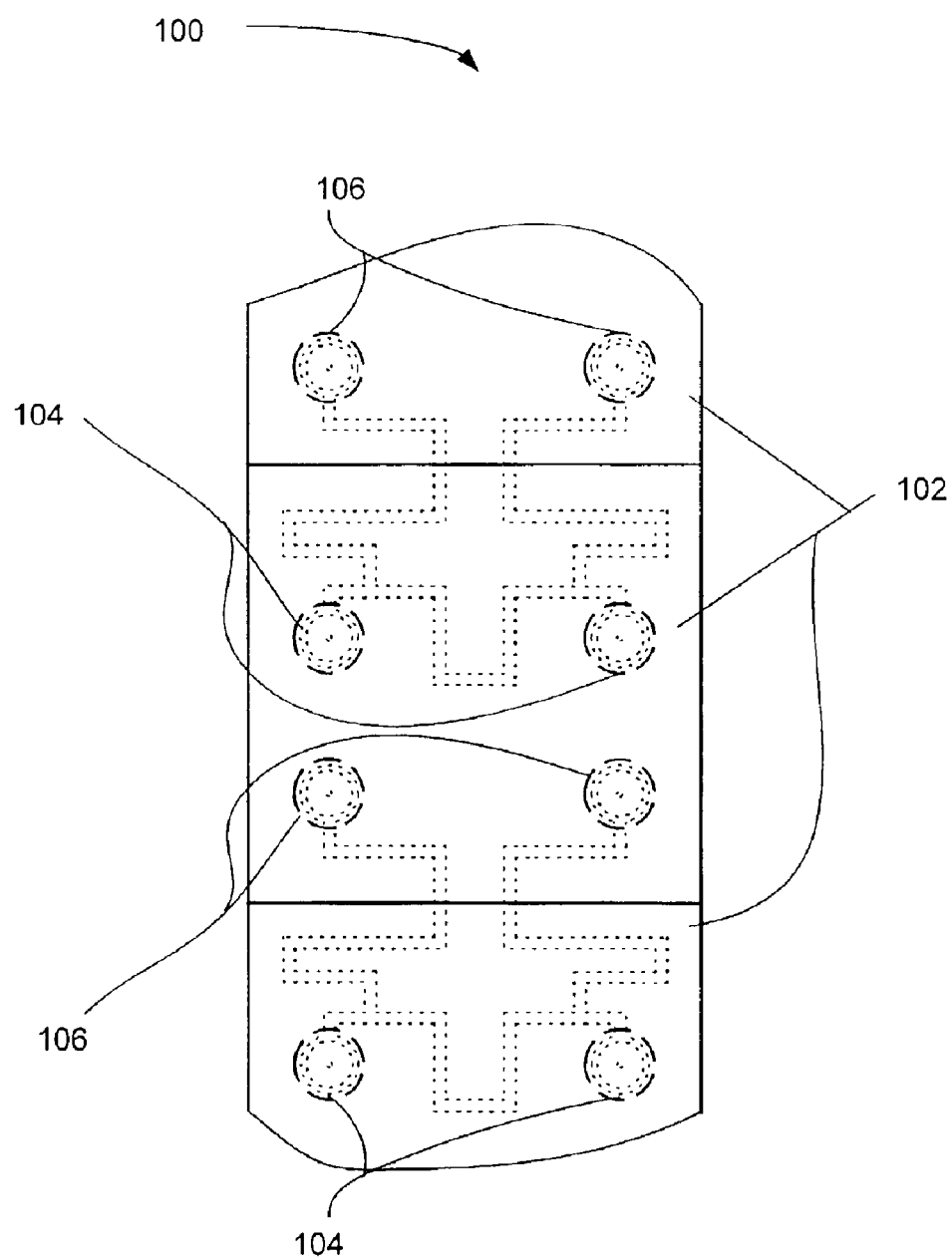
Figure 3B:
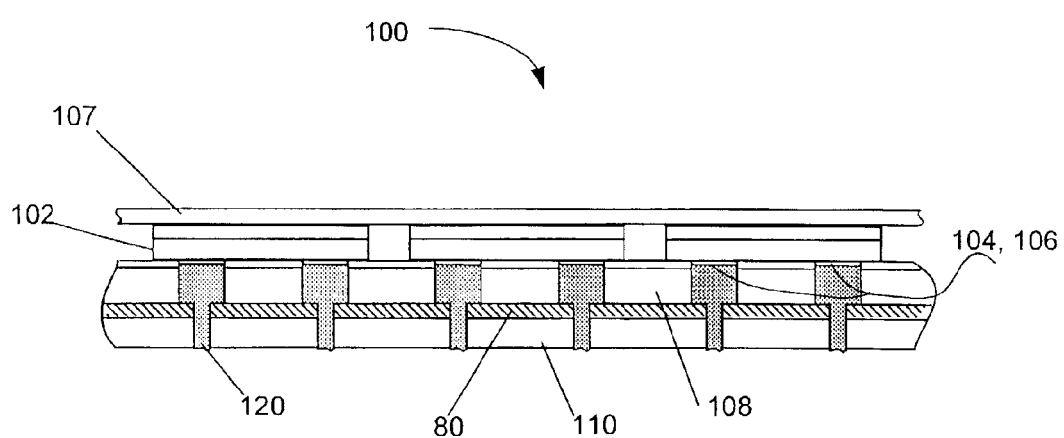
Figure 4A:
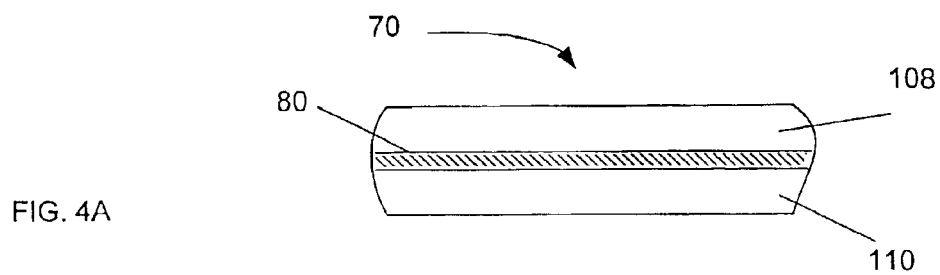
Figure 4B:
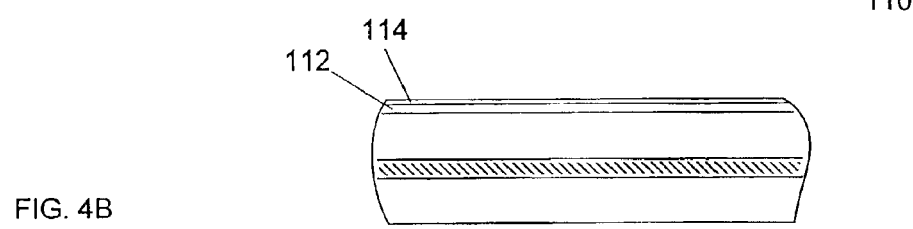
Figure 4C:
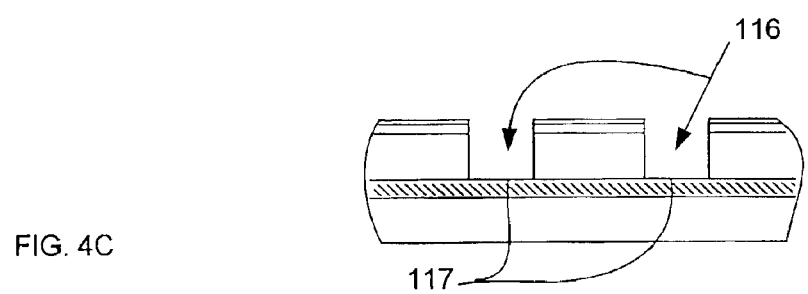
Figure 4D:
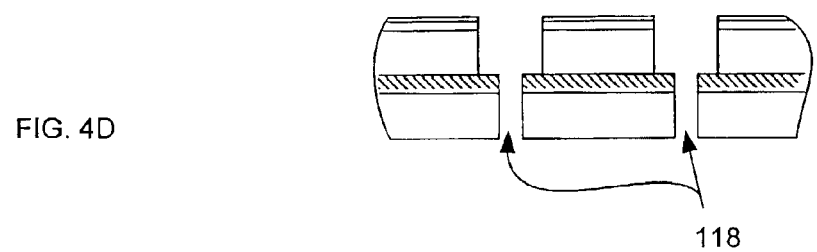
Figure 4E:
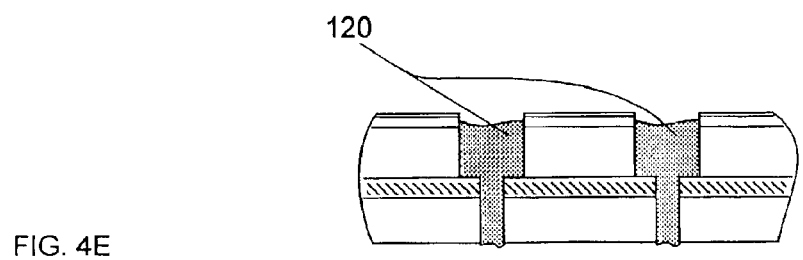
Figure 4F:
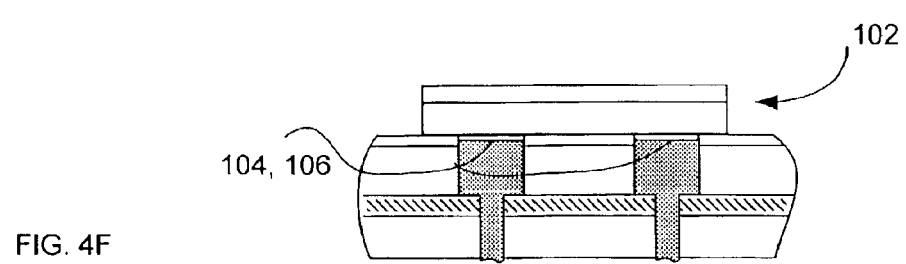
Figure 5:
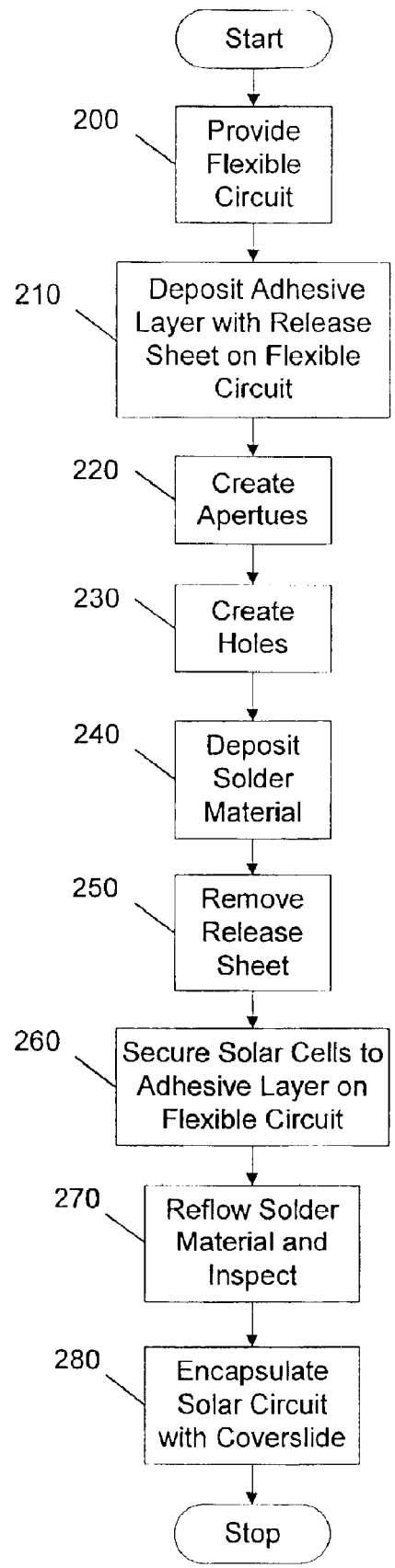

Having thus described the invention in general terms, reference will now be made to the accompanying drawings, which are not necessarily drawn to scale, and wherein:

FIG. 1 is a diagram of a coplanar solar cell using a wrapped-around contact;

FIG. 2 is a schematic diagram of a flexible circuit illustrating a plurality of electrically conductive paths laminated between two insulating sheets;

FIG. 3A is a partial top view of the solar tile of the present invention according to one embodiment;

FIG. 3B is a partial side view of one embodiment of the solar tile of the present invention;

FIGS. 4A–4F are schematic diagrams collectively illustrating some of the steps in the fabrication of the solar tile according to one embodiment of the present invention; and FIG. 5 is a flow diagram illustrating the fabrication method according to one embodiment of the present invention.

DETAILED DESCRIPTION OF THE INVENTION

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Referring to FIGS. 2, 3A and 3B, the solar tile 100 includes a flexible circuit 70 that comprises at least one electrically conductive path 80 laminated between front 108 and rear 110 insulating sheets. The electrically conductive path 80 interconnects the solar cells 102 that make up the solar tile 100 and, in a preferred embodiment, form a pattern within the insulating sheets 108, 110 such that a sufficient quantity of solar cells 102 can be interconnected together in series to generate the desired solar array voltage within each tile 100. The pattern can consist of any of a variety of different configurations as such are known to those skilled in the art, including the sinuous patterns depicted in the figures. By utilizing the flexible circuit 70, no discrete tile-to-tile interconnection is required, which makes the solar tile 100 a modular element in a solar array with the solar array containing solar tiles in parallel. The insulating sheets 108 110 serve as a dielectric to prevent electrical shorting between the solar cells 102, and between the solar cells 102 and any surface to which the solar tile 100 is capable of being mounted. The electrically conductive path 80 and insulating sheets 108, 110 can consist of a variety of different materials, as such are known to those skilled in the art. In one embodiment, for example, the flexible circuit 70 is a photolithography defined and etched copper pattern laminated between two sheets of KAPTON® polyimide film manufactured by the DuPont Company.

The solar tile 100 further includes a plurality of PV solar cells 102, portions of three of which are shown in FIG. 3A. Additionally, in one advantageous embodiment, the solar tile 100 includes a single coverslide 107, as described below.

Each solar cell 102 has coplanar contacts 104 and 106 that establish electrical contact with the p-type and n-type regions of the solar cell 102. As described above, coplanar contacts 104, 106 can be formed in various manners including wrapping the front contact around an edge of the cell 102 to the rear surface (proximate the flexible circuit), or by creating an opening from the rear surface to the region proximate the front surface (opposite the flexible circuit). Also, as illustrated in FIG. 3A, in a preferred embodiment each solar cell 102 has redundant contacts to improve reliability and provide strain relief for thermal-cycle survivability. Typically, the solar cells 102 are made from Si, but it should be understood that coplanar solar cells 102 made from other types of materials can be implemented without departing from the spirit and scope of the present invention. For example, GaAs/Ge based solar cells that use coplanar contact configurations can be used.

Referring to FIGS. 4A–4F and FIG. 5, the method of fabricating the solar tile 100, according to one embodiment, begins with providing the flexible circuit 70 having at least one electrically conductive path 80 laminated between the front 108 and rear 110 insulating sheets, as illustrated in FIG. 4A (see block 200). A transfer adhesive layer 112, such as an acrylic adhesive, is then applied to the front insulating sheet 108 of the flexible circuit 70 (see block 210). In one embodiment, shown in FIG. 4B, the adhesive layer 112 includes a release sheet 114 that carries the adhesive layer 112 and is positioned opposite the front insulating sheet 108.

Next, as illustrated in FIG. 4C, apertures 116 are created through the front insulating sheet 108 of the flexible circuit 70 to expose contact locations 117 in the electrically conductive path 80 (see block 220). In this regard, the front insulating sheet 108 is the sheet that will subsequently be disposed proximate the solar cells 102, while the rear insulating sheet 110 will eventually be positioned opposite the solar cells 102. Each aperture 116 can have any one of a variety of different diameters, but typically the diameter measures between 0.080 and 0.120 inches. Additionally, the apertures 116 can be created using any of a number of different methods, such as are known to those skilled in the art. For example, in one embodiment, the apertures 116 are created using a carbon dioxide ($CO_2$) laser to vaporize the release sheet 114, adhesive layer 112, and front insulating sheet 108. Advantageously, in embodiments where the electrically conductive path 80 is made of copper, the strong reflection of the copper at the $CO_2$ laser wavelength provides a natural stop for the laser penetration such that the aperture 116 extends to the electrically conductive path 80 of the flexible circuit 70, but no further as shown in FIG. 4C. Because of the efficiency of the $CO_2$ laser vaporizing process, the contact locations 117 in the electrically conductive path 80 preferably may not require any additional cleanup after the apertures 116 are created.

After the apertures 116 are created, holes 118 are created through the electrically conductive path 80 and the rear insulating sheet 110 (see block 230). As shown in FIG. 4D, these holes 118 are typically formed at the center of each contact location 117. The holes 118 have diameters smaller than the apertures 116 and typically measure between 0.02 and 0.04 inches. The holes 118 can be created using any of a number of known methods. In one embodiment, for example, the holes 118 are created using a Yttrium Aluminum Garnet ($Y_3Al_5O_{12}$) laser to vaporize the electrically conductive path 80 and rear insulating sheet 110. As described below, the holes 118 advantageously allow inspection of the solder material 120 reflow from the rear insulation sheet 110. Additionally, the holes 118, in combination with the apertures 116 allow the solder material 120 to form interconnect structures 90 in the flexible circuit 70 to add mechanical stability and reliability to the solar tile 100.

After the holes 118 are created in the flexible circuit 70, solder material 120, such as solder paste, is deposited in each aperture 116 and hole 118 defined by the flexible circuit 70, as shown in FIG. 4E (see block 240). The solder material 120 can comprise any of a number of materials, such as, for example, lead, silver or tin. As the solder material 120 is deposited, the release sheet 114 acts as a solder material template to guide the solder material 120 into the aperture 116 defined by the flexible circuit 70 and prevent solder material 120 from accidentally being deposited on the adhesive layer 112. Because the release sheet 114 acts as a template, the solder material 120 can be deposited in a silk-screen manner so that the same amount of solder material 120 is uniformly deposited in each aperture 116 and hole 118. After the solder material 120 is deposited in the apertures/holes, the release sheet 114 is removed (see block 250) to expose the adhesive layer 112 and solder material visible within the apertures 116.

After the release sheet 114 is removed from the adhesive layer 112, the solar cells 102 are transferred and secured to the flexible circuit 70 with the adhesive layer 112 to create a resulting solar circuit, as illustrated in FIG. 4F (see block 260). While the solar circuit can be assembled in any of a variety of different methods, in one advantageous embodiment, a machine or robot is used to assemble the solar circuit. By using a machine, the solar cells 102 can be uniformly placed very close to one another, and expensive and critical alignment tooling normally used to place solar cells 102 are eliminated. And, by eliminating manual handling of the solar cells 102, contamination of the solar cells 102 and cell breakage are reduced.

In assembling the solar circuit, the solar cells 102 are preferably placed on the flexible circuit 70 so that the gap between each solar cell 102 measures between three and seven thousandths of an inch, with a five thousandths of an inch nominal gap. The solar cells 102 can be transferred to the flexible circuit 70 using a variety of different methods. For example, in one embodiment, before the solar cells 102 are transferred to the flexible circuit, the solar cells 102 are mechanically pre-placed onto a temporary tack mat in their respective positions, with the solar cell contacts 104, 106 face up. In this embodiment, a machine, such as a 4-axis robot with an integrated charge coupled device (CCD) camera vision system, such as those manufactured by Seiko Instruments Inc., is used to precisely place the solar cells 102 in their required position. In this regard, the robot typically includes a processing unit that is responsive to the CCD camera for determining the center point and rotation angle of each solar cell 102. Based upon these parameters and the desired spacing or gap between adjacent cells, the robot can properly position each solar cell 102 upon the temporary tack mat so that the solar cell 102 will be in the desired position with the resulting array of solar cells 102. By using a machine to place the solar cells 102, as many as 500 or more solar cells 102 can be placed per hour.

Each solar cell 102 is then placed on the temporary tack mat in its required circuit position. After all of the solar cells 102 are pre-placed, the solar cells 102 are transferred to the flexible circuit 70 by mating the solar cells 102 on the tack mat with the flexible circuit 70. In one embodiment, the tack mat holding the solar cells 102 and the flexible circuit 70 are each secured to separate vacuum chucks and the vacuum chucks are mated to transfer the solar cells 102 onto the adhesive layer 112 on the flexible circuit 70. However, other techniques for transferring the solar cells 102 to the adhesive layer 112 on the flexible circuit 70 can be employed.

Following solar cell 102 transfer and mounting to the flexible circuit 70, the solder material 120 is reflowed to insure the solder material 120 achieves mechanical and electrical communication with the solar cell contacts 104, 106 and the electrically conductive path 80 (see block 270). Many different methods known to those skilled in the art can be used to reflow the solder material 120. For example, in a preferred embodiment, a vapor phase reflow soldering method is employed. In this regard, a vapor phase solder system, such as any of a number of devices manufactured by the Centech Corporation, can be used to reflow the solder material 120. In this embodiment, the assembled solar circuit is first preheated by exposure to infrared radiation at a temperature of 80° C. for ninety seconds. Next, the solar circuit is transferred into a chamber containing a superheated vapor, such as a superheated Fluorinert™ vapor. The chamber is maintained above the 215° C. boiling point of Fluorinert™ liquid (manufactured by the Minnesota Mining and Manufacturing (3M) Company), which is also above the reflow temperature of the solder material 120 such that all of the solder material 120 reflows. The solar circuit is kept in the superheated vapor for a period of time sufficient to insure complete solder material reflow, such as fifty seconds in one embodiment. It should be understood, however, that the times and temperatures described above are for illustrative purposes only, and that the solar circuit can be preheated and superheated for different times and to different temperatures.

By forming openings that extend completely through the flexible circuit 70, the solder material 120 that will form each connection is visible through the hole 118 that opens through the rear insulating sheet 110. By viewing the solder exposed within each hole 118 during the reflow process, it can be determined that reflow has occurred. In this regard, the solder material 120 generally becomes much more reflective after reflow. Solder reflow monitoring can be either done manually or with a camera or other vision system to ensure that the solder material 120 reflects a substantially greater percentage of the incident light during and after the reflow process. By verifying that the solder material 120 within each opening has reflowed, the likelihood that the solder material has formed proper electrical and mechanical connections with each solar cell contact 104, 106 is greatly increased. Proper electrical and mechanical connections, in turn, increase the reliability of the solar tiles 100 and decrease the number of defective solar tiles 100 that must be scrapped, in comparison to conventional fabrication techniques.

The solar circuit is then removed and placed in an oven having a reduced pressure environment to vacuum bake the solder circuit to remove excess Fluorinert™ liquid remaining on the solar circuit. Advantageously, as the solder material 120 cools in the apertures 116 and holes 118, it forms interconnect structures in the flexible circuit 70 since the solder material 120 extends through the electrically conductive path 80 and the rear insulating sheet 110. The interconnect structures, in turn, add mechanical stability and reliability to the solar tile 100 throughout the expanse of the flexible circuit.

In a preferred embodiment, after the solder material 120 has reflowed, the fabrication of the solar tile 100 continues with the solar circuit being encapsulated by the coverslide 107 to protect the solar cells 102 from the environment (see block 280). As previously stated, because hand-assembled space PV arrays generally have non-uniform spacing between cells, and because space PV arrays typically use PV cells with front/rear surface contacts, space PV arrays generally require each solar cell to have its own coverslide. Unfortunately, individual coverslides add manufacturing cost to space PV arrays, and result in both the cell edges and cell-to-cell interconnects being exposed to the potentially damaging plasma. Decreasing the potential damage caused by the exposed edges and interconnects, typically requires space PV array voltages to be maintained below 50 volts and/or all exposed interconnects to be conformal coated with a dielectric material which results in a significant harness loss for higher power applications and/or additional integration cost and mass to the array.

Referring again to FIG. 3B, because all of the solar cells 102 are generally uniformly spaced, and the solar cell contacts 104, 106 are all coplanar on the surface of the solar cell 102 secured to the flexible circuit 70, a single large coverslide 107 can be applied to cover the entire solar circuit. In this manner, a single coverslide 107 can cover multiple solar cells 102. As previously mentioned, due to cost and weight factors, space PV cells require very thin coverslides. As such, while the coverslide 107 can be any of a number of different thicknesses, a typical coverslide thickness measures between five and twelve thousandths of an inch. In like manner, while the coverslide 107 can be made of a variety of different materials and, in a preferred embodiment, the coverslide 107 is made of glass. Also, in one embodiment, the coverslide glass includes doping such as ceria that helps prevent coverslide darkening by particulate radiation. The coverslide 107 can be mounted to the solar cells 102 in various manners. For example, in one embodiment, the coverslide 107 is mounted over the solar cells 102 using an optically transparent adhesive, such as space-grade, DC 93–500 adhesive.

The solar tile 100 and method of fabrication of the present invention therefore allow the solar cells 102 to be placed such that a single coverslide 107 covers the entire solar tile 100. The use of a single coverslide 107 reduces cell edge and cell-to-cell interconnect exposure to damaging plasma radiation, and allows the solar tile 100 to safely operate above 50 volts without conformal coating on the interconnects. The method of fabricating the solar tile 100, according to one embodiment, also allows inspection of the solder connections during fabrication to insure solder connection integrity. Additionally, the solar tile 100 of the present invention contains solder connections that form interconnect structures that add mechanical stability and reliability to the solar tile 100.

Many modifications and other embodiments of the invention will come to mind to one skilled in the art to which this invention pertains having the benefit of the teachings presented in the foregoing descriptions and the associated drawings. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed:

1. A method for fabricating a solar tile comprising:
providing a flexible circuit comprising at least one electrically conductive path laminated between two insulating sheets;
creating a plurality of openings completely through the flexible circuit including the at least one electrically conductive path and the insulating sheets, thereby defining a contact location with the electrically conductive path within each opening;
depositing an electrically conductive solder material within each opening such that the electrically conductive solder material and an exposed portion of the electrically conductive path are in electrical communication at the respective contact location;
providing a plurality of photovoltaic solar cells having two major opposing surfaces, each solar cell comprising at least one pair of contacts of opposing polarity disposed upon one surface of the solar cell; and
securing the plurality of solar cells to the flexible circuit such that the contacts of the solar cells are aligned with the plurality of openings, said securing step comprising reflowing and thereafter cooling the solder material such that the solder material and the contacts of the solar cells are in mechanical and electrical contact.

2. A method according to claim 1 further comprising depositing an adhesive layer on the flexible circuit, wherein creating the plurality of openings comprises creating a plurality of openings completely through the adhesive layer and the flexible circuit, and wherein securing the plurality of solar cells comprises securing the plurality of solar cells to the adhesive layer.

3. A method according to claim 2 wherein the adhesive layer includes a release sheet opposite the flexible circuit, wherein creating the plurality of openings comprises creating a plurality of openings completely through the release sheet, the adhesive layer and the flexible circuit, said method further comprising removing the release sheet following depositing the electrically conductive solder material.

4. A method according to claim 1 wherein creating a plurality of openings comprises creating a plurality of apertures through one of the insulating sheets, and creating a plurality of holes completely through the at least one electrically conductive path and the other insulating sheet thereby defining the contact location within each aperture, wherein the holes are of a smaller diameter than the apertures.

5. A method according to claim 1 further comprising inspecting the solder material during reflowing of the solder material, wherein said inspecting comprises viewing the solder material through the plurality of openings created through the insulating sheet opposite the plurality of solar cells to ensure that the solder material reflows.

6. A method according to claim 1 wherein securing the plurality of solar cells comprises forming a plurality of solder connections that extend from a respective contact on the solar cell and through a corresponding opening defined by the at least one electrically conductive path, wherein each solder connection forms an interconnect structure between the at least one electrically conductive path and the insulating sheets.

* * * * *